(12) United States Patent
Wan (10) Patent No.: US 12,114,486 B2
(45) Date of Patent: Oct. 8, 2024

(54) SEMICONDUCTOR STRUCTURE AND METHOD FOR FORMING THE SAME (71) Applicant: CHANGXIN MEMORY TECHNOLOGIES, INC., Anhui (CN)

(72) Inventor: Wei Wan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 495 days.

(21) Appl. No.: 17/370,323

(22) Filed: Jul. 8, 2021

(65) Prior Publication Data
US 2021/0335795 A1 Oct. 28, 2021

Related U.S. Application Data (63) Continuation of application No. PCT/CN2021/078515, filed on Mar. 1, 2021.

(30) Foreign Application Priority Data

Mar. 16, 2020 (CN) .......................... 202010180648.7

(51) Int. Cl.
H10B 12/00 (2023.01)
G11C 5/06 (2006.01)

(52) U.S. Cl.
CPC ........... *H10B 12/485* (2023.02); *G11C 5/063* (2013.01); *H10B 12/315* (2023.02); *H10B 12/488* (2023.02)

(58) Field of Classification Search
CPC .............................. H10B 12/485; H10B 12/488
See application file for complete search history.

(56) References Cited

U.S. PATENT DOCUMENTS

| 8,659,111 B2 | 2/2014 | Kim |
| 9,230,858 B2 | 1/2016 | Kim et al. |
| 9,379,004 B1 | 6/2016 | Kwon et al. |

(Continued)

FOREIGN PATENT DOCUMENTS

| CN | 102237335 B | 5/2015 |
| CN | 105719998 A | 6/2016 |

(Continued)

OTHER PUBLICATIONS

International Search Report in the international application No. PCT/CN2021/078515, mailed on May 26, 2021, 2 pgs.

(Continued)

*Primary Examiner* — Peter M Albrecht
(74) *Attorney, Agent, or Firm* — Syncoda LLC; Feng Ma (57) ABSTRACT A semiconductor structure and a method for forming the same are provided. The method includes: providing a semiconductor substrate; determining a position of a bit line contact opening on a top surface of the semiconductor substrate and a top surface of a first dielectric layer; etching an active region, the first dielectric layer and an isolation structure exposed by the bit line contact opening according to the position of the bit line contact opening until the active region is etched to a preset depth to form a bit line contact window; and forming a second dielectric layer on a surface of the isolation structure and a surface of the first dielectric layer that have a depth greater than a depth of a surface of the active region in the bit line contact window.

19 Claims, 9 Drawing Sheets

(56) References Cited

U.S. PATENT DOCUMENTS

| | | |
|---|---|---|
| 9,515,022 B2 | 12/2016 | Kwon et al. |
| 10,170,362 B2 | 1/2019 | Chang et al. |
| 10,840,182 B2 | 11/2020 | Chang et al. |
| 2012/0153456 A1 | 6/2012 | Kim |
| 2012/0326214 A1 | 12/2012 | Cho |
| 2013/0075909 A1* | 3/2013 | Park ............ H10B 12/488 257/751 |
| 2013/0119462 A1* | 5/2013 | Kye ............. H10B 12/485 257/331 |
| 2014/0127903 A1 | 5/2014 | Kim et al. |
| 2016/0035731 A1 | 2/2016 | Lee et al. |
| 2016/0181143 A1 | 6/2016 | Kwon et al. |
| 2016/0276273 A1 | 9/2016 | Kwon et al. |
| 2018/0190586 A1* | 7/2018 | Chang ........... H10B 12/485 |
| 2018/0240705 A1 | 8/2018 | Chang et al. |
| 2019/0080961 A1 | 3/2019 | Chang et al. |

FOREIGN PATENT DOCUMENTS

| | | |
|---|---|---|
| CN | 108470710 A | 8/2018 |
| KR | 20140078473 A | 6/2014 |

OTHER PUBLICATIONS

First Office Action of the Chinese application No. 202010180648.7, issued on Feb. 11, 2022, 15 pgs.

\* cited by examiner

SEMICONDUCTOR STRUCTURE AND METHOD FOR FORMING THE SAME

CROSS-REFERENCE TO RELATED APPLICATIONS

This is a continuation application of International Patent Application No. PCT/CN2021/078515, filed on Mar. 1, 2021, which claims priority to Chinese Patent Application No. 202010180648.7, filed on Mar. 16, 2020 and entitled "Semiconductor Structure and Forming Method". The disclosures of International Patent Application No. PCT/CN2021/078515 and Chinese Patent Application No. 202010180648.7 are incorporated by reference herein in their entireties.

TECHNICAL FIELD

This disclosure relates to the field of semiconductor devices and manufacturing, and particularly relates to a semiconductor structure and a forming method.

BACKGROUND

A Dynamic Random Access Memory (DRAM) is a semiconductor memory widely applied to products such as mobile phones, computers and automobiles. With the development of the science and technology, the feature sizes of integrated circuit devices are constantly shrinking, the critical sizes of the DRAM are getting smaller and smaller, and correspondingly, the manufacturing is getting more and more difficult. In the future, technologies related to DRAM manufacturing will continue to develop in smaller sizes, which places very strict electrical requirements on DRAM products.

However, the applicant found that as the critical sizes of the DRAM become smaller and smaller, in the existing DRAM manufacturing method, the problem of short-circuiting between conductive components may occur.

SUMMARY

The embodiments of this disclosure provide a semiconductor structure and a forming method. By backfilling etching defects at bottoms of bit line contact windows, the distance between the bit line contact window and the buried word line structure is increased, and the problems of possible short-circuiting between the bit line contact window and the buried word line structure caused by the etching defects, an increase of a parasitic capacitance, and a decrease of an electrical performance of the DRAM caused by a strong electric field are avoided.

In order to solve the above technical problems, according to a first aspect of this disclosure, a method for forming a semiconductor structure is provided, including following operations. A semiconductor substrate is provided. An isolation structure, an active region and a buried word line structure are already formed on the semiconductor substrate, and a first dielectric layer is formed at a top of the buried word line structure. A position of a bit line contact opening is determined on a top surface of the semiconductor substrate and a top surface of the first dielectric layer. The bit line contact opening at least exposes a part of the active region, and the bit line contact opening at least further exposes a part of the first dielectric layer or a part of the isolation structure. The active region, the first dielectric layer and the isolation structure exposed by the bit line contact opening are etched according to the position of the bit line contact opening until the active region is etched to a preset depth to form a bit line contact window. A second dielectric layer is formed on a surface of the isolation structure and a surface of the first dielectric layer that are positioned at a depth greater than a depth at which a surface of the active region in the bit line contact window is positioned.

Compared with related technologies, the embodiments of this disclosure improve the forming method of the bit line contact window, the position of the bit line contact opening is determined on the semiconductor substrate, and the semiconductor substrate exposed by the bit line contact opening is etched to the preset depth to form the bit line contact window. In this process, due to different etching selection ratios of etching materials, the etching depth of a part of the semiconductor substrate at the bottom of the bit line contact window is greater than the preset depth. By backfilling the second dielectric layer, the etching defects of this part are remedied, the distance between the bit line contact window and the buried word line structure is increased, and the problems of possible short-circuiting between the bit line contact window and the buried word line structure caused by the etching defects, and the decrease of the electrical performance of the DRAM caused by a strong electric field are avoided.

In addition, after the second dielectric layer is formed on the surface of the isolation structure and the surface of the first dielectric layer that are positioned at the depth greater than the depth at which the surface of the active region in the bit line contact window is positioned, the method further includes that a second dielectric layer is formed on a surface of the active region, a surface of the isolation structure and a surface of the first dielectric layer that are positioned at a depth greater than a preset depth.

In addition, a top surface of the second dielectric layer is flush with the preset depth.

In addition, the operation that the position of the bit line contact opening is determined on the top surface of the semiconductor substrate and the top surface of the first dielectric layer, includes that: a third dielectric layer is formed on the top surface of the semiconductor substrate and the top surface of the first dielectric layer; and the bit line contact opening is formed in the third dielectric layer.

In addition, the operation that the bit line contact opening is formed in the third dielectric layer, specifically includes following operation. A mask layer is formed on a top surface of the third dielectric layer, and an etching pattern required for subsequent formation of the bit line contact opening is formed on the mask layer, in which an orthographic projection of the etching pattern on the semiconductor substrate covers the active region between adjacent buried word line structures. The third dielectric layer is etched according to the etching pattern to form the bit line contact opening. An edge shape of the bit line contact window may be improved through the etching pattern in the mask layer, so that the orthographic projection of the bit line contact window on the surface of the semiconductor substrate can completely cover the active region between adjacent buried word line structures. Moreover, when silicon nitride is subsequently used to fill gaps, the bit line contact window can completely isolate the active region from a capacitor contact window, so as to solve the problem of short-circuiting between the capacitor contact window and the active region.

In addition, after the bit line contact opening is formed by etching or after the bit line contact window is formed by etching, the method further includes that: the mask layer on the top surface of the third dielectric layer is removed by etching.

In addition, the etching pattern is rectangular.

In addition, the operations that the mask layer is formed on the top surface of the third dielectric layer and the etching pattern required for subsequent formation of the bit line contact opening is formed on the mask layer, specifically includes that: a sub-mask layer is formed on the top surface of the third dielectric layer; an anti-reflection layer is formed on a top surface of the sub-mask layer; a photoresist is formed on a top surface of the anti-reflection layer; and the etching pattern is formed on the photoresist.

In addition, a thickness of the sub-mask layer is from 30 nm to 150 nm, a thickness of the photoresist is from 50 nm to 250 nm, and a thickness of the third dielectric layer is from 50 nm to 300 nm.

In addition, the operation that the second dielectric layer is formed on the surface of the isolation structure and the surface of the first dielectric layer that are positioned at the depth greater than the depth at which the surface of the active region in the bit line contact window is positioned, specifically includes that: the bit line contact window is filled to form a second dielectric intermediate layer; and the second dielectric intermediate layer is etched back to form the second dielectric layer, in which the etching back is to etch the second dielectric intermediate layer with a depth less than a depth of the surface of the active region. In addition, the filling is non-conformal filling.

According to a second aspect of this disclosure, a semiconductor structure is further provided, including: a semiconductor substrate, in which an isolation structure, an active region and a buried word line structure are already formed on the semiconductor substrate, and a first dielectric layer is formed at a top of the buried word line structure; a bit line contact window located in the semiconductor substrate with a preset depth, in which the bit line contact window at least exposes a part of the active region, and the bit line contact window at least further exposes a part of the first dielectric layer or a part of the isolation structure; and a second dielectric layer located at a bottom of the bit line contact window and located on a surface of the isolation structure or a surface of the first dielectric layer that is positioned at a depth greater than a depth at which a surface of the active region in the bit line contact window is positioned.

Compared with related technologies, in the embodiments of this disclosure, by means of the second dielectric layer, the distance between the bit line contact window and the buried word line structure is increased, and thus the problems of possible short-circuiting between the bit line contact window and the buried word line structure caused by the etching defects, the increase of the parasitic capacitance, and the decrease of the electrical performance of the DRAM caused by a strong electric field are avoided.

In addition, an orthographic projection of the bit line contact window on the semiconductor substrate covers the active region between adjacent buried word line structures. The edge shape of the bit line contact window is improved, and the orthographic projection of the formed bit line contact window on the semiconductor substrate can completely cover the active region, so that in the subsequent process of filling gaps, the bit line contact window can completely isolate the active region from the capacitor contact window, so as to avoid the problem of possible short-circuiting between the active region and the capacitor contact window.

DETAILED DESCRIPTION

As the critical sizes of the DRAM become smaller and smaller, in the existing DRAM manufacturing method, the problem of short-circuiting between conductive components may occur.

In order to solve the above problem, an embodiment of this disclosure provides a method for forming a semiconductor structure, including the following operations. A semiconductor substrate is provided. An isolation structure, an active region and a buried word line structure are already formed on the semiconductor substrate, and a first dielectric layer is formed at a top of the buried word line structure. A position of a bit line contact opening is determined on a top surface of the semiconductor substrate and a top surface of the first dielectric layer. The active region, the first dielectric layer and the isolation structure exposed by the bit line contact opening are etched according to the position of the bit line contact opening until the active region is etched to a preset depth to form a bit line contact window. A second dielectric layer is formed on a surface of the isolation structure and a surface of the first dielectric layer have a depth greater than a depth of a surface of the active region in the bit line contact window.

In order to make the objectives, technical solutions and advantages of the embodiments of this disclosure more clear, the embodiments of the disclosure will be described in detail below with reference to the accompanying drawings. However, those of ordinary skill in the art can understand that, in the embodiments of this disclosure, many technical details are proposed for readers to better understand this disclosure. However, even if these technical details and various changes and modifications based on the following embodiment are not provided, the technical solutions claimed by this disclosure can also be realized. The division of the following embodiments is intended for the convenience of description, and should not constitute any limitation on the specific implementation manners of this disclosure. The embodiments can be combined and cited with each other without contradiction.

Figure 1:
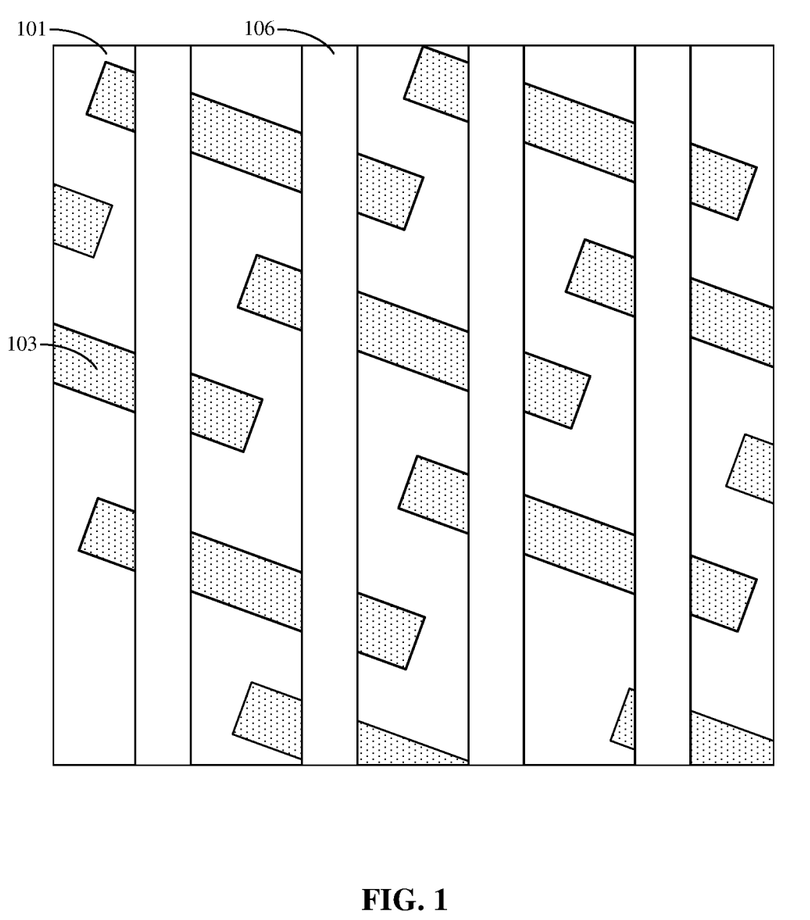
FIG. 1 is a schematic top view of a semiconductor substrate according to an embodiment of this disclosure.
Figure 2:
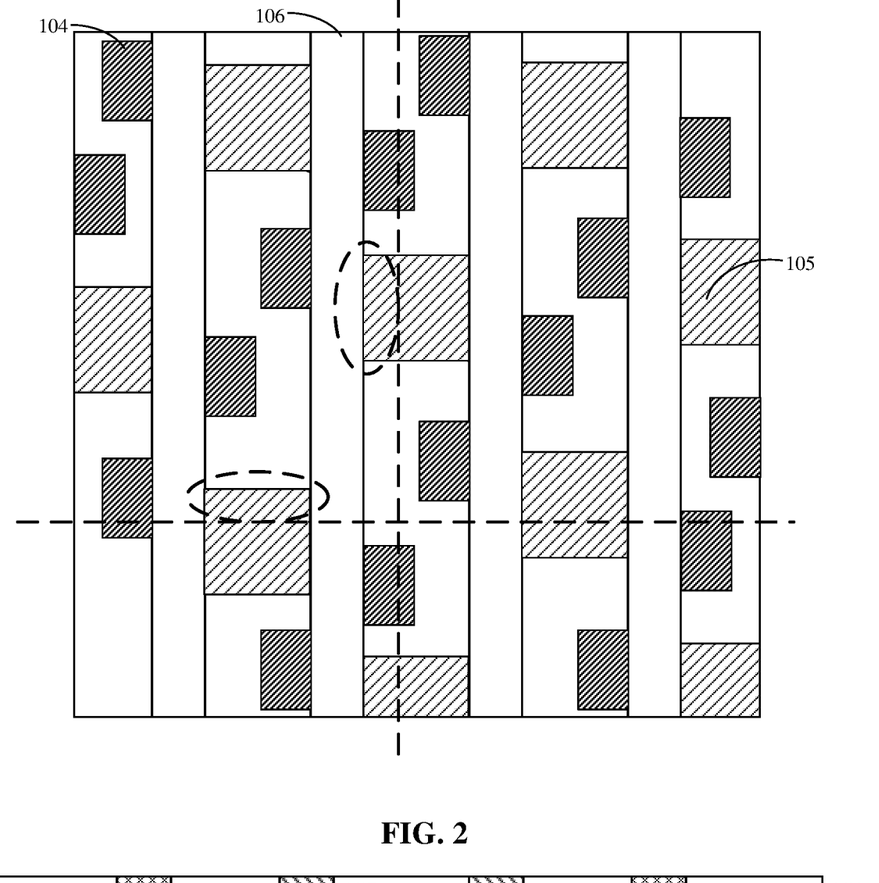
FIG. 2 is a schematic top view of a semiconductor structure after forming a bit line contact window and a capacitor contact window according to an embodiment of this disclosure.

FIG. 1 is a schematic top view of a semiconductor substrate according to an embodiment. FIG. 2 is a schematic top view of a semiconductor structure after forming a bit line contact window and a capacitor contact window according to this embodiment. FIG. 3 to FIG. 7 are schematic cross-sectional views of a semiconductor structure in a direction perpendicular to a bit line in a semiconductor forming method according to this embodiment. FIG. 8 to FIG. 12 are schematic cross-sectional views of a semiconductor structure in a direction parallel to a bit line in a semiconductor forming method according to this embodiment. FIG. 13 to FIG. 16 are schematic cross-sectional views of a backfilling process of a semiconductor structure in a direction perpendicular to a bit line according to this embodiment. FIG. 17 to FIG. 20 are schematic cross-sectional views of a backfilling process of a semiconductor structure in a direction parallel to a bit line according to this embodiment. The implementation details of the forming method of the semiconductor structure of this embodiment will be specifically described below.

This embodiment relates to a semiconductor structure formed by the semiconductor forming method, referring to FIG. 1, which shows a layout of active regions 103 and buried word line structures 106 in a semiconductor substrate 101. A reference is made to FIG. 2, which shows the position relationship among bit line contact windows 105, capacitor contact windows 104 and buried word line structures 106 formed by the embodiments of this disclosure. The bit line contact window 105 completely covers the active region 103 between the buried word line structures 106.

An orthographic projection of the formed bit line contact window 105 on the semiconductor substrate 101 can completely cover the active region 103, so that in the subsequent process of filling gaps, the bit line contact window 105 can completely isolate the active region 103 from the capacitor contact window 104, so as to avoid the problem of possible short-circuiting between the active region 103 and the capacitor contact window 104.

It is noted that in this embodiment, the bit line contact window 105 and the capacitor contact window 104 are illustrated as rectangles, which are only intended to cut off the active region 103 on a top-view plane, so as to facilitate the understanding of this solution by those skilled in the art without constituting a limitation on this solution. In practical applications, the bit line contact window 105 and the capacitor contact window 104 may be set to be oval, circular, trapezoidal, etc. As long as the shape meets the condition that the orthographic projection of the bit line contact window 105 on the semiconductor substrate 101 completely covers the active region 103, the shape is within the protection scope of this disclosure.

The schematic cross-sectional views perpendicular to the buried word line structure 106 are shown in FIG. 3 to FIG. 11. The semiconductor substrate structure provided in the figures is a schematic structural view, which is intended to let those skilled in the art understand the implementation method of this solution, and does not constitute a limitation on this solution. The semiconductor forming method includes the following operations.

In S101, a semiconductor substrate 101 is provided.

Isolation structures 111, active regions (not shown) and buried word line structures 106 are already formed on the semiconductor substrate 101, and a first dielectric layer 107 is formed at a top of the buried word line structure 106. It is noted that in this embodiment, the situation that a top surface of the first dielectric layer 107 is flush with a top surface of the semiconductor substrate 101 is described in detail. It is clear for those skilled in the art that, the situation defined in this embodiment that the top surface of the first dielectric layer 107 is flush with the top surface of the semiconductor substrate 101 does not constitute a limitation on this disclosure, but is only intended for clearly introducing the implementation processes of this solution.

It is noted that the material of the semiconductor substrate 101 includes silicon, silicon carbide, gallium arsenide, aluminum nitride, zinc oxide, etc. In this embodiment, the semiconductor substrate 101 is made of a silicon material. The use of the silicon material as the semiconductor substrate 101 in this embodiment is intended to facilitate the understanding of the subsequent formation method by those skilled in the art, and does not constitute a limitation. In a practical application process, a suitable material of the semiconductor substrate 101 can be selected according to requirements.

Figure 3:
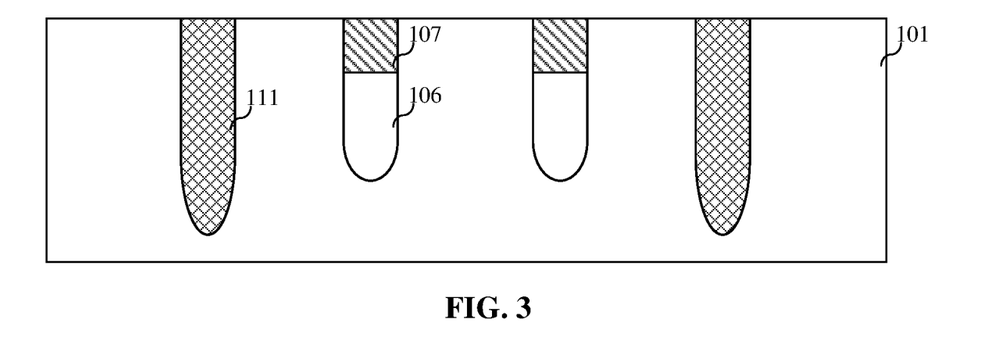
FIG. 3 to FIG. 7 are schematic cross-sectional views of a semiconductor structure in a direction perpendicular to a bit line in a semiconductor forming method according to an embodiment of this disclosure.

Referring to FIG. 3, the buried word line structure 106 is located within the semiconductor substrate 101, the first dielectric layer 107 is formed at the top of the buried word line structure 106, and the top surface of the first dielectric layer 107 is flush with the top surface of the semiconductor substrate 101. The active region (not shown) defined by the isolation structures 111 includes a part between the buried word line structures 106. In this embodiment, the isolation structure 111 uses a shallow-trench isolation groove.

Figure 4:
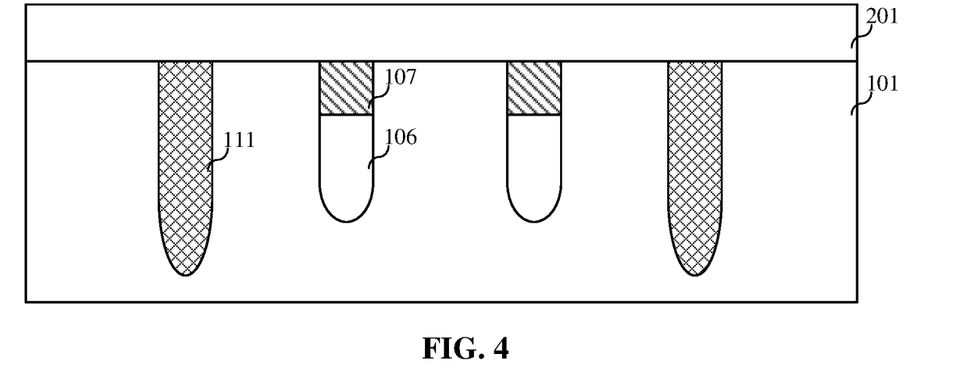

Referring to FIG. 4, in S102, a third dielectric layer 201 is formed on the top surface of the semiconductor substrate 101 and the top surface of the first dielectric layer 107.

It is noted that in this embodiment, the third dielectric layer 201 is formed at first and then a bit line contact opening 401 is formed in the third dielectric layer 201, which is taken as an example for description and does not constitute a limitation on this solution. In other embodiments, the position of the bit line contact opening can be determined directly on the top surface of the semiconductor substrate and the top surface of the first dielectric layer, and in the subsequent process, the position of the bit line contact opening is directly etched to form the bit line contact window.

Specifically, the material of the third dielectric layer 201 may be silicon nitride, silicon oxide or silicon oxynitride. In this embodiment, a thickness of the third dielectric layer 201 is from 50 nm to 300 nm, such as 100 nm, 150 nm, 200 nm or 250 nm.

Figure 5:
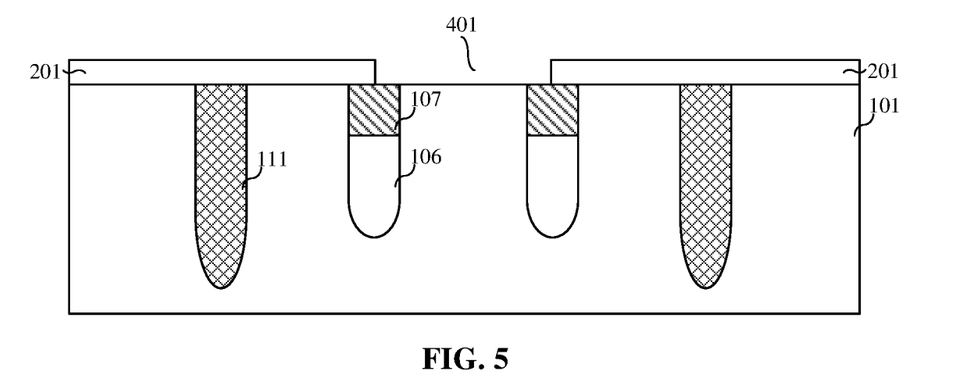

Referring to FIG. 5, in S103, the bit line contact opening 401 is formed in the third dielectric layer 201, and the bit line contact opening 401 at least exposes a part of the active region (not shown) and a part of the first dielectric layer 107.

Figure 6:
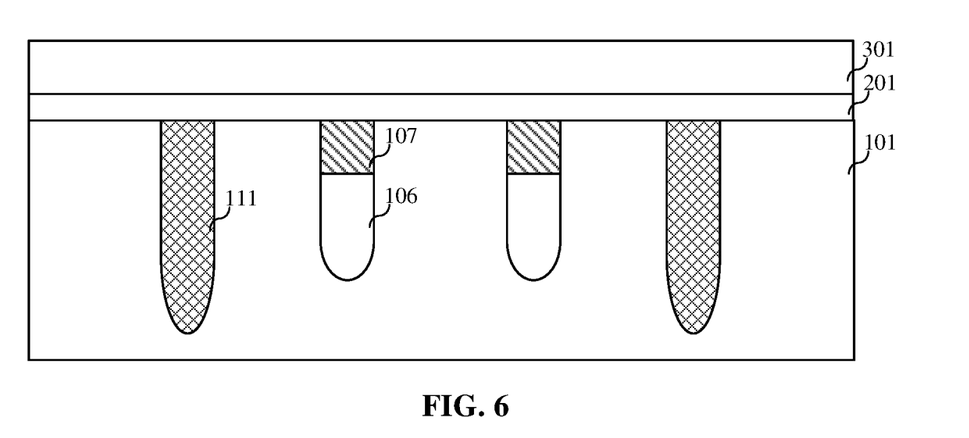

Specifically, referring to FIG. 6, in S103-1, a mask layer 301 is formed on a top surface of the third dielectric layer 201, and an etching pattern required for subsequent formation of the bit line contact opening 401 is formed on the mask layer 301.

It is noted that the orthographic projection of the etching pattern on the semiconductor substrate 101 is located between adjacent buried word line structures 106 and completely covers the active region between adjacent buried word line structures.

Figure 7:
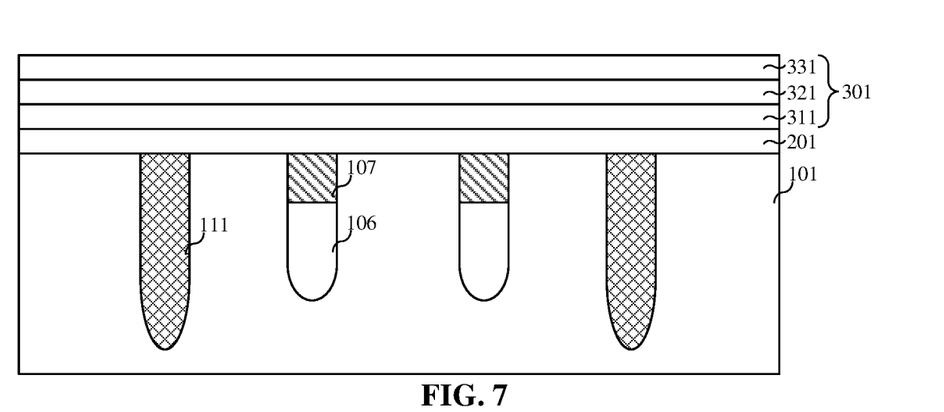

In this embodiment, referring to FIG. 7, the mask layer 301 includes a sub-mask layer 311, an anti-reflection layer 321 and a photoresist 331. Specifically, the sub-mask layer 311 is formed on the top surface of the third dielectric layer 201, the anti-reflection layer 321 is formed on a top surface of the sub-mask layer 311, and the photoresist 331 is formed on a top surface of the anti-reflection layer 321. Further, the etching pattern is formed on the photoresist 331. Specifically, the material of the sub-mask layer 311 includes carbon, silicon, silicon oxide or silicon nitride. In this embodiment, a thickness of the sub-mask layer 311 is from 30 nm to 150 nm, such as 50 nm, 80 nm, 100 nm or 130 nm, and a thickness of the photoresist is from 50 nm to 250 nm, such as 100 nm, 150 nm or 200 nm.

In S103-2, the third dielectric layer 201 is etched according to the etching pattern to form the bit line contact opening 401, the mask layer 301 on the top surface of the third dielectric layer 201 is removed by etching, and then, the structure as shown in FIG. 5 is formed.

Specifically, the etching is performed according to the etching pattern on the photoresist 331. The anti-reflection layer 321, the sub-mask layer 311 and the third dielectric layer 201 are etched off in sequence to form an opening, and then, the remaining photoresist 331, anti-reflection layer 321 and sub-mask layer 311 are etched off to form the bit line contact opening 401. Compared with the opening, the bit line contact opening 401 is characterized in that only the height of the opening is reduced, and the bottom structure of the opening may not be changed.

It is noted that the mask layer 301 on the top surface of the third dielectric layer 201 may be removed by etching after the bit line contact opening 401 is formed by etching, or may be removed by etching after the bit line contact window 105 is subsequently formed by etching. In this embodiment, the mask layer 301 is removed by etching after the mask layer 301 on the top surface of the third dielectric layer 201 is removed by etching, which is taken as an example for description and does not constitute a limitation on this disclosure.

Figure 8:
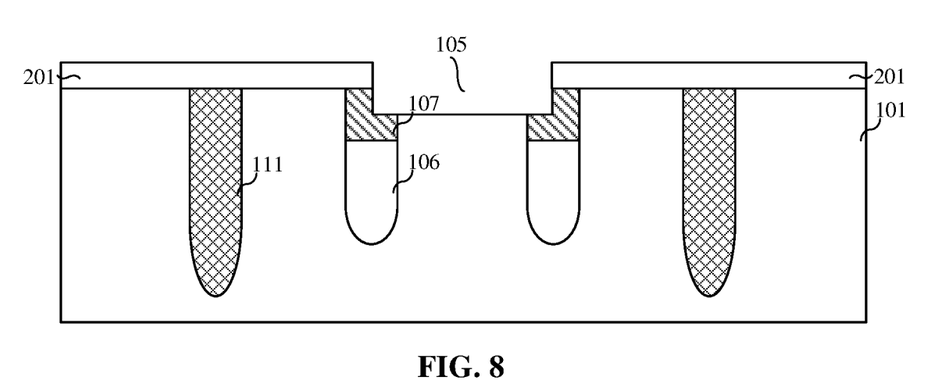
FIG. 8 to FIG. 12 are schematic cross-sectional views of a semiconductor structure in a direction parallel to a bit line in a semiconductor forming method according to an embodiment of this disclosure.

Referring to FIG. 8, in S104, the active region (not shown) at the bottom of the bit line contact opening 401 and the first dielectric layer 107 are etched to a preset depth to form the bit line contact window 105.

Figure 9:
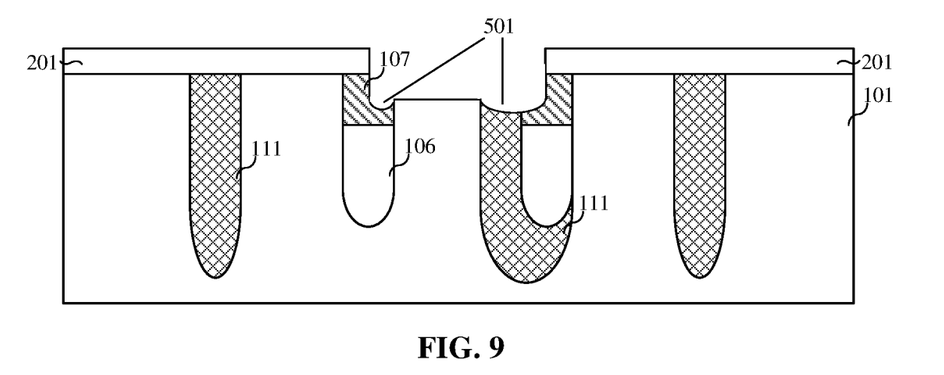

Referring to FIG. 9, due to structural design factors in the early stage, a part of the buried word line structure 106 is located in the isolation structure 111. When the etching pattern on the photoresist 331 is transferred to the surface of the semiconductor substrate 101, the bottom of the bit line contact opening 401 has a part of the surface of the first dielectric layer 107, a part of the surface of the semiconductor substrate 101 and a part of the surface of the isolation structure 111. Further, due to different selection ratios of etching materials (usually, the etching rate of etching materials to silicon oxide and silicon nitride is greater than that of a silicon material), when the bottom of the bit line contact opening 401 is formed, the etching rate of the first dielectric layer 107 and the isolation structure 111 is greater than that of the semiconductor substrate 101. In this case, gaps (i.e., etching defects 501) will be formed. As a result, the distance between the bit line contact window 105 formed by filling in the later stage and the buried word line structure 106 is too short, thereby causing the problem of short-circuiting between the bit line contact window 105 and the buried word line structure 106 or the decrease of the electrical performance caused by a strong electric field.

In S105, a second dielectric layer 602 is formed on a surface of the isolation structure 111 and a surface of the first dielectric layer 107 that have a depth greater than a depth of a surface of the active region (not shown). It is noted that a preset depth should be less than a depth of the bottom surface of the first dielectric layer 107.

Specifically, in S105-1, the bit line contact window is filled to form a second dielectric intermediate layer 601.

Figure 10:
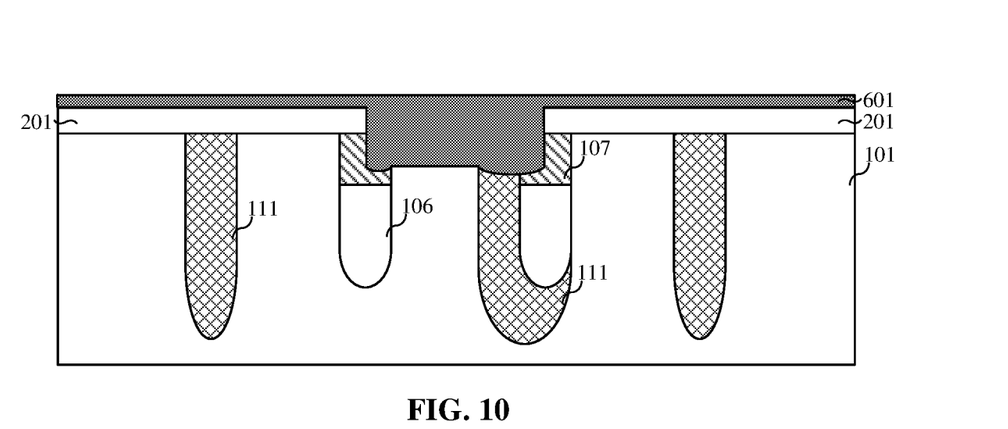

Referring to FIG. 10, the second dielectric intermediate layer 601 is formed on the top surface of the third dielectric layer 201 and in the bit line contact window 105, and the material of the second dielectric intermediate layer 601 usually is silicon oxide.

It is noted that in this embodiment, the filling of the bit line contact window 105 is a non-conformal filling. In other embodiments, the bit line contact window may also be filled in a conformal filling manner.

In S105-2, the second dielectric intermediate layer 601 is etched back to form the second dielectric layer 602. Herein, the etching back is to etch the second dielectric intermediate layer 601 having a depth less than a depth of the surface of the active region (not shown).

Figure 11:
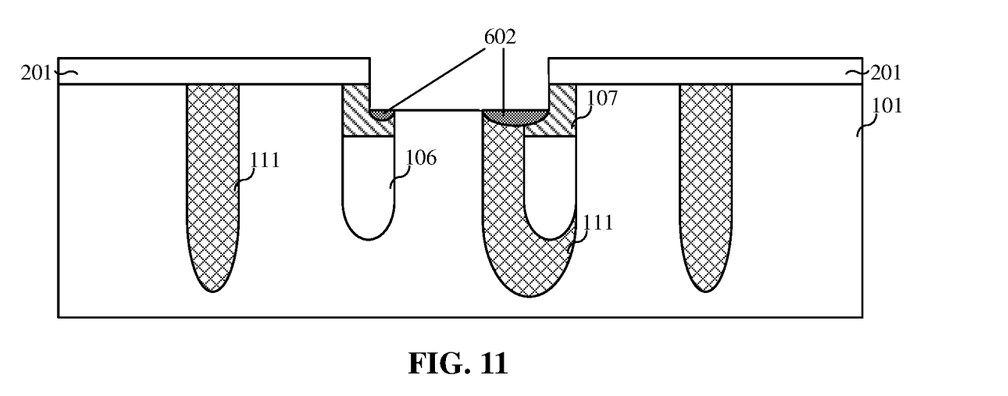

Referring to FIG. 11, the second dielectric intermediate layer 601 on the top surface of the third dielectric layer 201 is etched, and the second dielectric intermediate layer 601 in the bit line contact window 105 is etched to the surface of the active region, to form the second dielectric layer 602.

Since all etched materials at this time are the second dielectric intermediate layers 601, the materials are etched at the same etching rate. When the bit line contact opening 401 is etched to expose the surface of the semiconductor substrate 101 at the bottom of the bit line contact opening, the positions where the etching defects 501 are originally formed are filled with the second dielectric layers 602, so as to avoid the problems of short-circuiting between the bit line contact window 105 and the buried word line structure 106 caused by the etching defects 501, and the decrease of the electrical performance caused by a strong electric field.

A second dielectric intermediate layer 601 is filled in the bit line contact opening 401, and then, the second dielectric intermediate layer 601 is etched back. In this case, since the etched material is the same material, the etching rate is the same, and the etched bottom surface is relatively flat. When the surface of the semiconductor substrate 101 is exposed by etching, the etching is stopped. Since the etching rate is the same, the parts where the etching defects are originally formed and which are filled with the second dielectric intermediate layer 601 are not removed by etching. By backfilling the etching defects 501 caused by the previous alignment problem, the distance between the bit line contact window 105 and the buried word line structure 106 is increased, and the problems of short-circuiting between the bit line contact window 105 and the buried word line structure 106, and the decrease of the electrical performance caused by a strong electric field are avoided.

It is noted that in other embodiments, after the second dielectric layer is formed on the surface of the isolation structure and the surface of the first dielectric layer that have the depth greater than the depth of the surface of the active region, the method further includes: the second dielectric layer is formed on a surface of the active region, a surface of the isolation structure and a surface of the first dielectric layer that each have a depth greater than the preset depth. The top surface of the second dielectric layer is flush with the preset depth. In this way, the distance between the bit line contact window and the buried word line structure is further increased.

The schematic cross-sectional views parallel to the buried word line structure 106 are shown in FIG. 12 to FIG. 20. The semiconductor substrate structure provided in the figures is a schematic structural view, which is intended to let those skilled in the art understand the implementation method of this solution, and does not constitute a limitation on this solution. The method for forming the semiconductor specifically includes following operations. The parts similar to the above-mentioned parts perpendicular to the buried word line structure 106 will not be repeated here.

In S101, a Semiconductor Substrate 101 is Provided.

Figure 12:
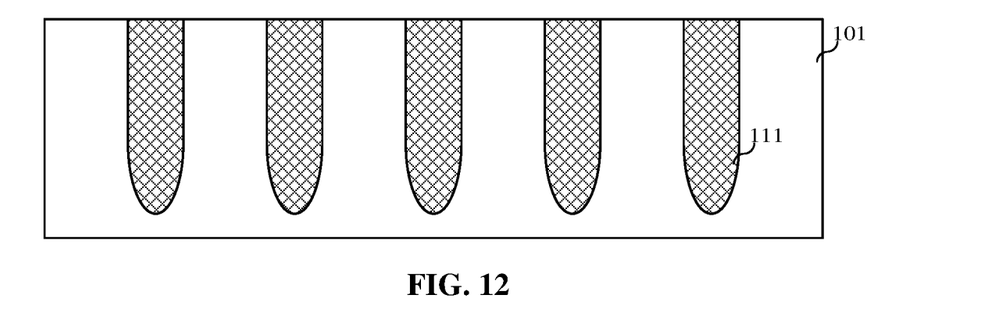

Referring to FIG. 12, a plurality of isolation structures 111 are formed in the semiconductor substrate 101, and active regions (not shown) defined by the isolation structures 111 are located in the semiconductor substrate 101.

Figure 13:
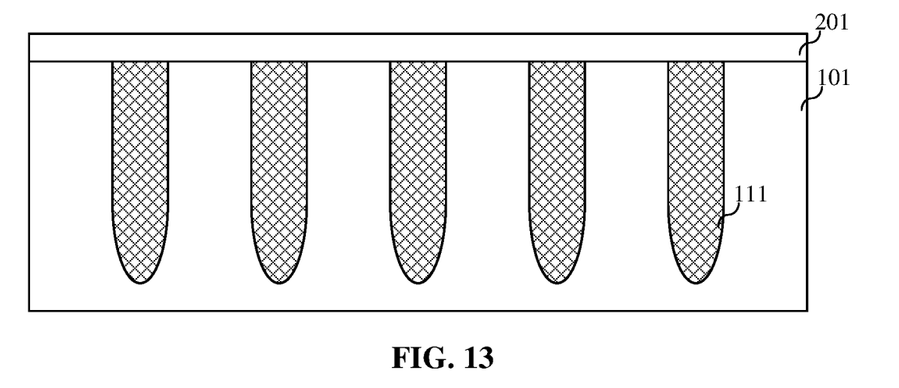
FIG. 13 to FIG. 16 are schematic cross-sectional views of a backfilling process of a semiconductor structure in a direction perpendicular to a bit line according to an embodiment of this disclosure.

Referring to FIG. 13, in S102, a third dielectric layer 201 is formed on the top surface of the semiconductor substrate 101 and the top surface of the first dielectric layer 107.

Figure 14:
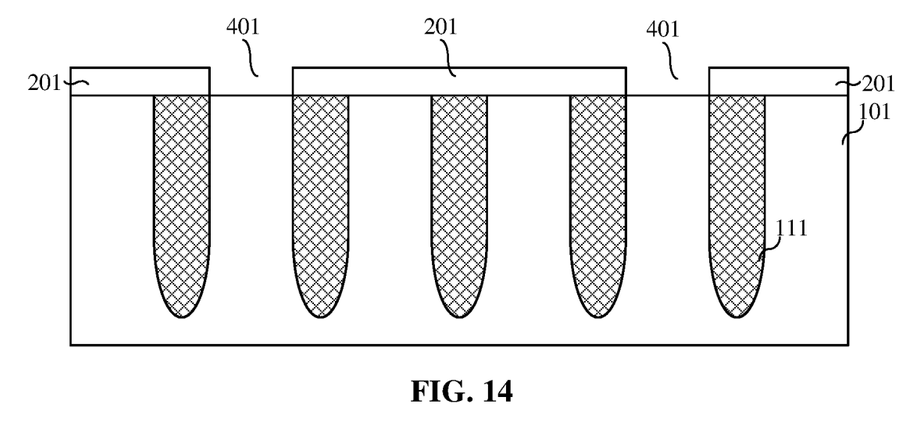

Referring to FIG. 14, in S103, bit line contact openings 401 are formed in the third dielectric layer 201, and each the bit line contact openings 401 at least exposes a part of the active region (not shown) and a part of the isolation structure 111.

Figure 15:
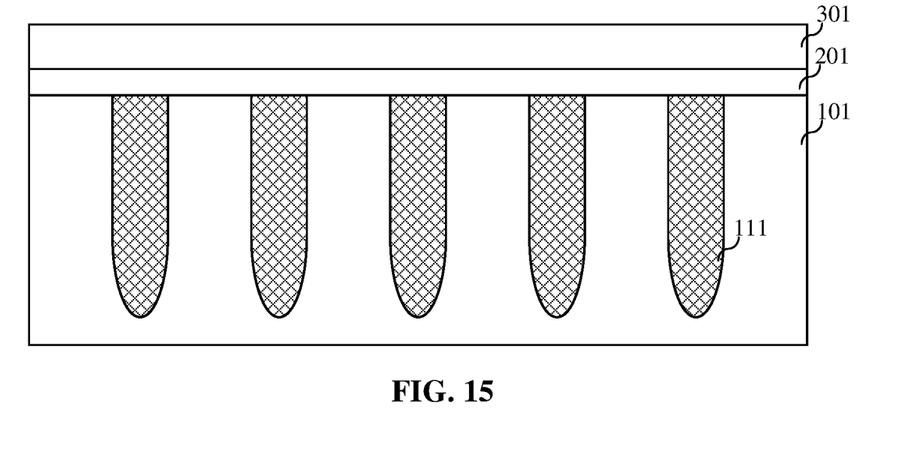

Specifically, referring to FIG. 15, in S103-1, a mask layer 301 is formed on the top surface of the third dielectric layer 201, and an etching pattern required for subsequent formation of the bit line contact opening 401 is formed on the mask layer 301.

It is noted that the orthographic projection of the etching pattern on the semiconductor substrate 101 is located between adjacent buried word line structures 106 and completely covers the active region between adjacent buried word line structures 106.

Figure 16:
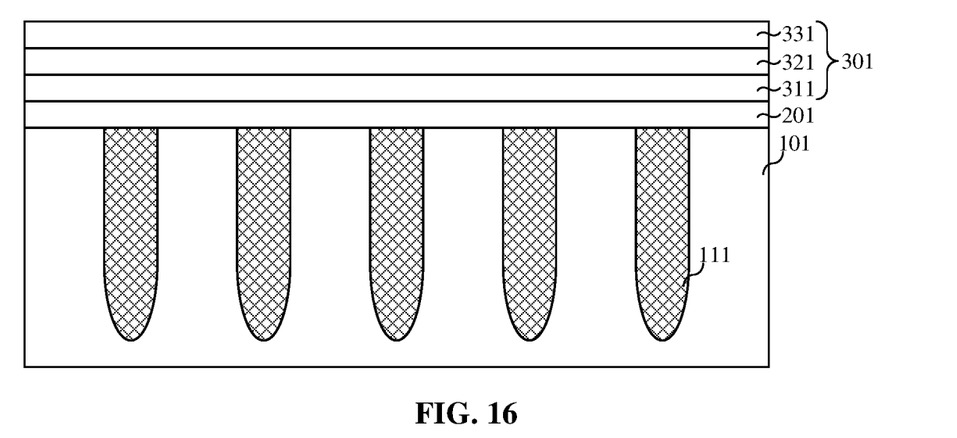

In this embodiment, referring to FIG. 16, the mask layer 301 includes a sub-mask layer 311, an anti-reflection layer 321 and a photoresist 331. Specifically, the sub-mask layer 311 is formed on the top surface of the third dielectric layer 201, the anti-reflection layer 321 is formed on the top surface of the sub-mask layer 311, the photoresist 331 is formed on the top surface of the anti-reflection layer 321, and the etching pattern is formed on the photoresist 331.

In S103-2, the third dielectric layer 201 is etched according to the etching pattern to form the bit line contact openings 401, the mask layer 301 on the top surface of the third dielectric layer 201 is removed by etching, and then, the structure as shown in FIG. 14 is formed.

Specifically, the etching is performed according to the etching pattern on the photoresist 331. The anti-reflection layer 321, the sub-mask layer 311, the third dielectric layer 201 and a part of the semiconductor substrate 101 are etched off in sequence to form openings, and then, the remaining photoresist 331, anti-reflection layer 321 and sub-mask layer 311 are etched off to form the bit line contact openings 401.

It is noted that the mask layer 301 on the top surface of the third dielectric layer 201 may be removed by etching after the bit line contact openings 401 are formed by etching, or may be removed by etching after bit line contact windows 105 are subsequently formed by etching. In this embodiment, the mask layer 301 is removed by etching after the mask layer 301 on the top surface of the third dielectric layer 201 is removed by etching, which is taken as an example for description and does not constitute a limitation on this disclosure.

Figure 17:
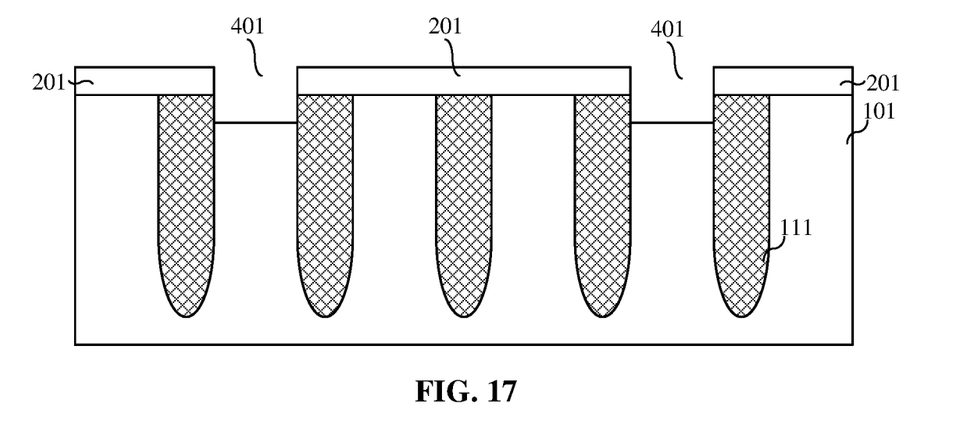
FIG. 17 to FIG. 20 are schematic cross-sectional views of a backfilling process of a semiconductor structure in a direction parallel to a bit line according to an embodiment of this disclosure.

Referring to FIG. 17, in S104, the active regions and the isolation structures 111 at the bottoms of the bit line contact openings 401 are etched to a preset depth to form the bit line contact windows 105.

Figure 18:
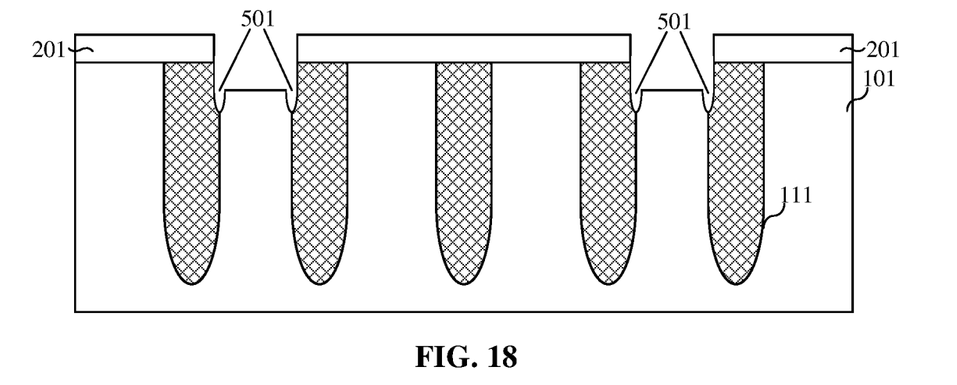

Referring to FIG. 18, due to the alignment problem in the early stage of a semiconductor structure manufacturing process, the etching pattern is not aligned when transferred to the semiconductor substrate 101. As a result, the bottoms of the formed bit line contact openings 401 each expose a part of the surface of each of some of the isolation structures 111. Due to different selection ratios of etching materials (usually, the etching rate of etching materials to silicon oxide and silicon nitride is greater than that of a silicon material), when the bottom of the bit line contact opening 401 is formed, the etching rate of the isolation structure 111 is greater than that of the semiconductor substrate 101. In this case, etching defects 501 may be formed. Or, due to the influence of undercutting, etching defects 501 may also be formed. As a result, the distance between the bit line contact window 105 formed by filling in the later stage and the buried word line structure 106 is too short, thereby causing the problem of short-circuiting between the bit line contact window 105 and the buried word line structure 106 or the decrease of the electrical performance caused by a strong electric field.

In S105, a second dielectric layer 602 is formed on a surface of the isolation structure 111 and a surface of the first dielectric layer 107 that have a depth greater than a depth of the surface of the active region. Here, due to the influence of photolithography misalignment or undercutting, a part of the active region closely adjacent to the isolation structure 111 or the first dielectric layer 107 may be excessively etched. As a result, a depth of the active region at an edge position may be greater than the preset depth, that is, greater than the depth of the surface of the active region in the middle region in the bit line contact window 105. It is noted that the preset depth should be less than the thickness of the first dielectric layer 107.

Specifically, in S105-1, the bit line contact windows are filled to form a second dielectric intermediate layer 601.

Figure 19:
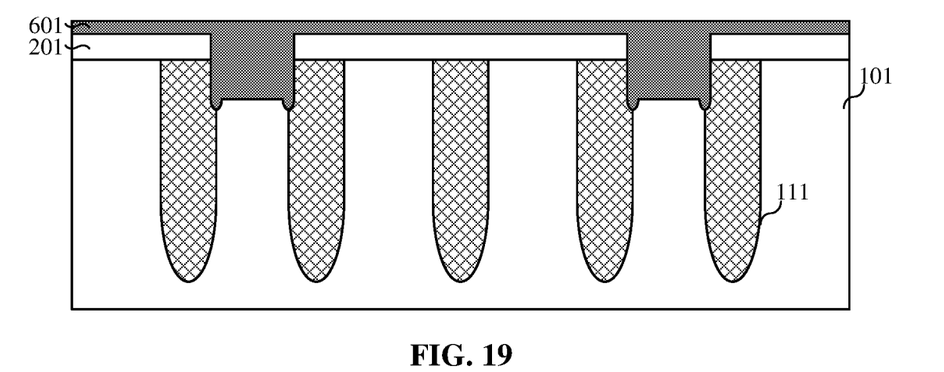

Referring to FIG. 19, a second dielectric intermediate layer 601 is formed on the top surface of the third dielectric layer 201 and in the bit line contact windows 105, and the material of the second dielectric intermediate layer 601 usually is silicon oxide.

In S105-2, the second dielectric intermediate layer 601 is etched back to form a second dielectric layer 602. The etching back is to etch the second dielectric intermediate layer 601 with a depth less than a depth of the surface of the active region.

Figure 20:
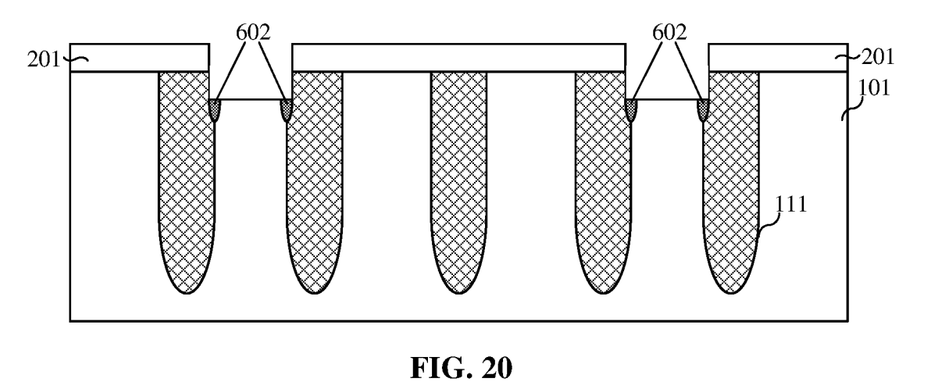

Referring to FIG. 20, the second dielectric intermediate layer 601 on the top surface of the third dielectric layer 201 is etched, and the second dielectric intermediate layers 601 in the bit line contact windows 105 are etched to a preset height to form the second dielectric layers 602.

After the bit line contact window 105 is formed, a capacitor contact window 104 is subsequently formed. FIG. 2 is a schematic top view of a semiconductor structure. The bit line contact windows 105 completely cover active regions between adjacent buried word line structures 106, the capacitor contact windows 104 cover active regions at edges of the buried word line structures 106, and the bit line contact windows 105 and the capacitor contact windows 104 cover all active regions, thereby ensuring that when silicon nitride is subsequently used to fill gaps, the active regions that should be in contact with the bit line contact windows 105 and the capacitor contact windows 104 are short-circuited.

Compared with related technologies, by backfilling the etching defects at the bottoms of bit line contact windows, the distance between the bit line contact window and the buried word line structure is increased, and the problems of possible short-circuiting between the bit line contact window and the buried word line structure caused by the etching defects, and the decrease of the electrical performance of the DRAM caused by a strong electric field are avoided.

Furthermore, the orthographic projection of the formed bit line contact window 105 on the semiconductor substrate 101 can completely cover the active region 103, so that in the subsequent process of filling gaps with silicon nitride, the bit line contact window 105 can completely isolate the active region 103 from the capacitor contact window 104, so as to avoid the problem of possible short-circuiting between the active region 103 and the capacitor contact window 104. Furthermore, the forming method and the manufacturing process are simple and stable, and the cost is saved.

The division of the above steps is only for clarity of description. When implemented, the steps can be combined into one step or some steps can be split into multiple steps. As long as they include the same logical relationship, they all fall within the protection scope of this disclosure. In addition, adding insignificant modifications or introducing insignificant designs to the process without changing the core design of the process all fall within the protection scope of this disclosure.

Figure 21:
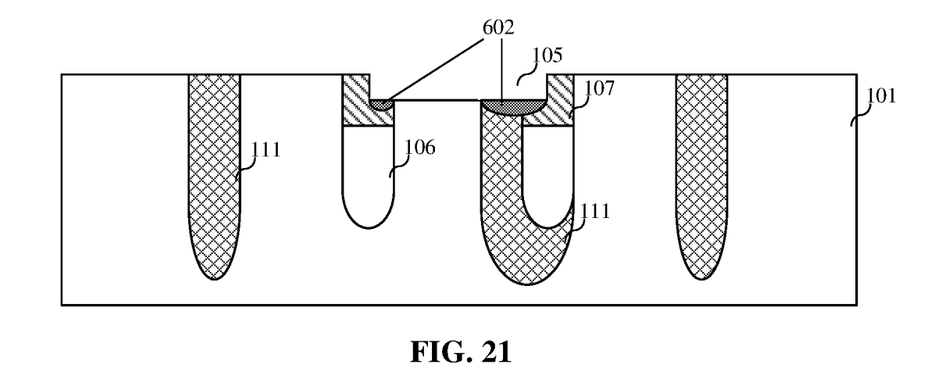
FIG. 21 and FIG. 22 are schematic views of a semiconductor structure according to another embodiment of this disclosure.
Figure 22:
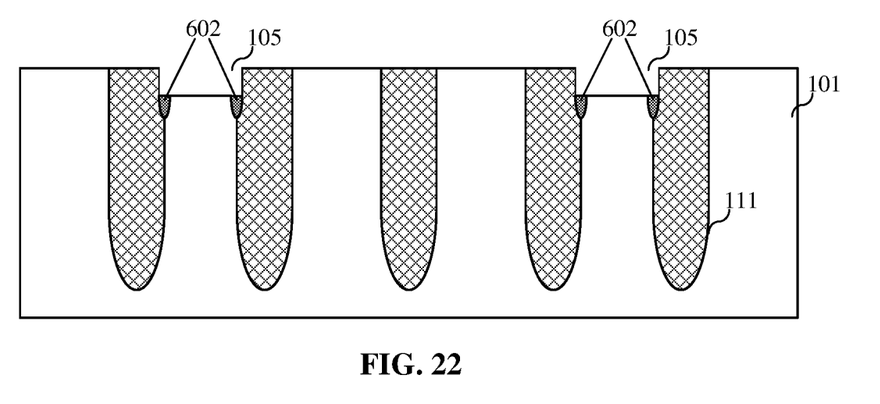

Another embodiment of this disclosure relates to a semiconductor structure. FIG. 2 is a schematic top view of the semiconductor structure. FIG. 21 and FIG. 22 are schematic cross-sectional views of the semiconductor structure.

The semiconductor structure includes a semiconductor substrate 101. Isolation structures 111, active regions (not shown) and buried word line structures 106 are already formed on the semiconductor substrate 101, and a first dielectric layer 107 is formed at a top of the buried word line structure 106.

Specifically, the buried word line structure 106 is located within the semiconductor substrate 101, the first dielectric layer 107 is formed at the top of the buried word line structure 106, and a top surface of the first dielectric layer 107 is flush with a top surface of the semiconductor substrate 101. The active region (not shown) defined by the isolation structure 111 is located between the buried word line structures 106. In this embodiment, the isolation structure 111 is a shallow-trench isolation groove.

It is noted that the material of the semiconductor substrate 101 includes silicon, germanium, silicon-on-insulator, silicon carbide, gallium arsenide, aluminum nitride, zinc oxide, etc. In this embodiment, the semiconductor substrate 101 is made of a silicon material. The use of the silicon material as the semiconductor substrate 101 in this embodiment is intended to facilitate the understanding of the subsequent formation method by those skilled in the art, and does not constitute a limitation. In a practical disclosure process, a suitable material of the semiconductor substrate 101 can be selected according to requirements.

It is noted that in this embodiment, the solution that the semiconductor substrate does not include the third dielectric layer, is taken as an example for description and does not constitute a limitation on this solution. That is, in this embodiment, the semiconductor structure does not include the third dielectric layer. In other words, the semiconductor structure is formed in a manner of determining the position of the bit line contact opening on the top surface of the semiconductor substrate 101 and the top surface of the first dielectric layer 107 and forming the bit line contact window 105 by etching according to the position of the bit line contact opening. In other embodiments, referring to FIG. 11 and FIG. 20, the semiconductor substrate 101 further includes: a third dielectric layer 201 located on the top surface of the semiconductor substrate 101 and the top surface of the first dielectric layer 107. The material of the third dielectric layer 201 may be silicon nitride, silicon oxide or silicon oxynitride, and the thickness of the third dielectric layer 201 is from 50 nm to 300 nm.

Bit line contact windows 105 are located in the semiconductor substrate 101 with a preset depth. The bit line contact window 105 at least exposes a part of the active region, and the bit line contact window 105 at least further exposes a part of the first dielectric layer 107 or a part of the isolation structure 111.

Second dielectric layers 602 are located at the bottoms of the bit line contact windows 105 and on surfaces of the isolation structures 111 or surfaces of the first dielectric layers 107 that have a depth greater than a depth of the surfaces of the active regions.

Referring to FIG. 2, in this embodiment, the orthographic projection of the bit line contact window on the semiconductor substrate covers the active region between adjacent buried word line structures 106. The bit line contact windows completely cover the active regions between adjacent buried word line structures 106, the capacitor contact windows 104 cover the active regions at the edges of the buried word line structures 106, and the bit line contact windows 105 and the capacitor contact windows 104 cover all active regions, thereby ensuring that when silicon nitride is subsequently used to fill gaps, the active regions that should be in contact with the bit line contact windows 105 and the capacitor contact windows 104 are short-circuited.

Compared with related technologies, by backfilling the etching defects caused in the early stage, the distance between the bit line contact window and the buried word line structure is increased, and thus the problems of short-circuiting between the bit line contact window and the buried word line structure, and the decrease of the electrical performance caused by a strong electric field are avoided.

Furthermore, the orthographic projection of the formed bit line contact window on the semiconductor substrate can completely cover the active region, so that in the subsequent process of filling gaps with silicon nitride, the bit line contact window can completely isolate the active region from the capacitor contact window, so as to avoid the possible problem of short-circuiting between the active region and the capacitor contact window.

Since the above embodiments and this embodiment correspond to each other, this embodiment can be implemented in cooperation with the above embodiments. The related technical details mentioned in the above embodiments are still valid in this embodiment, and the technical effects that can be achieved in the above embodiments can also be achieved in this embodiment. In order to reduce the repetition, the details are not repeated here. Correspondingly, the related technical details mentioned in this embodiment can also be applied to the above embodiments.

A person of ordinary skill in the art can understand that the above embodiments are specific embodiments for implementing this disclosure. In practical applications, various changes can be made in form and details without departing from the spirit and scope of this disclosure.

The invention claimed is:

1. A method for forming a semiconductor structure, comprising:
   providing a semiconductor substrate, wherein an isolation structure, an active region and a buried word line structure are formed on the semiconductor substrate, and a first dielectric layer is formed on a top surface of the buried word line structure;
   determining a position of a bit line contact opening on a top surface of the semiconductor substrate and a top surface of the first dielectric layer, wherein the bit line contact opening at least exposes a part of the active region, and the bit line contact opening at least further exposes a part of the first dielectric layer or a part of the isolation structure;

etching the active region, the first dielectric layer and the isolation structure exposed by the bit line contact opening according to the position of the bit line contact opening until the active region is etched to a preset depth to form a bit line contact window; and forming a second dielectric layer on a surface of the isolation structure and a surface of the first dielectric layer that are positioned at a depth greater than a depth at which a surface of the active region in the bit line contact window is positioned;

wherein a top surface of the second dielectric layer is flush with the surface of the active region in the bit line contact window and lower than the top surface of the semiconductor substrate, and a top of the second dielectric layer is wider than a bottom of the second dielectric layer.

2. The method for forming the semiconductor structure of claim 1, wherein forming the second dielectric layer on the surface of the isolation structure and the surface of the first dielectric layer that are positioned at the depth greater than the depth at which the surface of the active region in the bit line contact window is positioned comprises: forming the second dielectric layer on a surface of the active region, a surface of the isolation structure and a surface of the first dielectric layer that are positioned a depth greater than the preset depth.

3. The method for forming the semiconductor structure of claim 1, wherein the determining the position of the bit line contact opening on the top surface of the semiconductor substrate and the top surface of the first dielectric layer comprises:

forming a third dielectric layer on the top surface of the semiconductor substrate and the top surface of the first dielectric layer and forming the bit line contact opening in the third dielectric layer.

4. The method for forming the semiconductor structure of claim 3, wherein the forming the bit line contact opening in the third dielectric layer specifically comprises:

forming a mask layer on a top surface of the third dielectric layer, and forming, on the mask layer, an etching pattern required for subsequent formation of the bit line contact opening, wherein an orthographic projection of the etching pattern on the semiconductor substrate covers the active region between adjacent buried word line structures; and etching the third dielectric layer according to the etching pattern to form the bit line contact opening.

5. The method for forming the semiconductor structure of claim 4, further comprising after forming the bit line contact opening by etching or after forming the bit line contact window by etching: removing the mask layer on the top surface of the third dielectric layer by etching.

6. The method for forming the semiconductor structure of claim 4, wherein the etching pattern is rectangular.

7. The method for forming the semiconductor structure of claim 4, wherein the forming the mask layer on the top surface of the third dielectric layer and forming, on the mask layer, the etching pattern required for subsequent formation of the bit line contact opening specifically comprise:

forming a sub-mask layer on the top surface of the third dielectric layer; forming an anti-reflection layer on a top surface of the sub-mask layer; forming a photoresist on a top surface of the anti-reflection layer; and forming the etching pattern on the photoresist.

8. The method for forming the semiconductor structure of claim 7, wherein a thickness of the sub-mask layer is from 30 nm to 150 nm.

9. The method for forming the semiconductor structure of claim 7, wherein a thickness of the photoresist is from 50 nm to 250 nm.

10. The method for forming the semiconductor structure of claim 3, wherein a thickness of the third dielectric layer is from 50 nm to 300 nm.

11. The method for forming the semiconductor structure of claim 1, wherein the forming the second dielectric layer on the surface of the isolation structure and the surface of the first dielectric layer that are positioned at the depth greater than the depth at which the surface of the active region in the bit line contact window is positioned specifically comprises:

filling the bit line contact window to form a second dielectric intermediate layer; and etching back the second dielectric intermediate layer to form the second dielectric layer, wherein the etching back is to etch the second dielectric intermediate layer with a depth less than a depth of the surface of the active region.

12. The method for forming the semiconductor structure of claim 10, wherein the filling is a non-conformal filling.

13. A semiconductor structure, comprising:

a semiconductor substrate, wherein an isolation structure, an active region and a buried word line structure are formed on the semiconductor substrate, and a first dielectric layer is formed at a top of the buried word line structure;

a bit line contact window located in the semiconductor substrate with a preset depth, wherein the bit line contact window at least exposes a part of the active region, and the bit line contact window at least further exposes a part of the first dielectric layer or a part of the isolation structure; and a second dielectric layer located at a bottom of the bit line contact window and located on a surface of the isolation structure or a surface of the first dielectric layer that is positioned at a depth greater than a depth at which a surface of the active region in the bit line contact window is positioned;

wherein a top surface of the second dielectric layer is flush with the surface of the active region in the bit line contact window and lower than a top surface of the semiconductor substrate, and a top of the second dielectric layer is wider than a bottom of the second dielectric layer.

14. The semiconductor structure of claim 13, wherein an orthographic projection of the bit line contact window on the semiconductor substrate covers the active region between adjacent buried word line structures.

15. The semiconductor structure of claim 13, wherein a top surface of the first dielectric layer is flush with the top surface of the semiconductor substrate.

16. The semiconductor structure of claim 15, wherein a third dielectric layer is formed on the top surface of the semiconductor substrate and the top surface of the first dielectric layer and the bit line contact window is formed in the third dielectric layer.

17. The semiconductor structure of claim 16, wherein a thickness of the third dielectric layer is from 50 nm to 300 nm.

18. The semiconductor structure of claim 16, wherein the third dielectric layer is made of silicon nitride, silicon oxide or silicon oxynitride.

19. The semiconductor structure of claim 13, wherein the bit line contact window is rectangle, oval, circular or trapezoidal.

* * * * *